(12) United States Patent
Leussler (10) Patent No.: US 7,345,481 B2
(45) Date of Patent: Mar. 18, 2008

(54) HYBRID TEM/BIRDCAGE COIL FOR MRI

(75) Inventor: Christoph G. Leussler, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 38 days.

(21) Appl. No.: 10/595,861

(22) PCT Filed: Nov. 3, 2004

(86) PCT No.: PCT/IB2004/052290

§ 371 (c)(1),
(2), (4) Date: May 17, 2006

(87) PCT Pub. No.: WO2005/050237

PCT Pub. Date: Jun. 2, 2005

(65) Prior Publication Data

US 2007/0079253 A1  Apr. 5, 2007

Related U.S. Application Data

(60) Provisional application No. 60/520,880, filed on Nov. 18, 2003.

(51) Int. Cl.
*G01V 3/00* (2006.01)
(52) U.S. Cl. ...................... 324/318; 324/322
(58) Field of Classification Search ................ 324/318, 324/322; 600/422
See application file for complete search history.

(56) References Cited

U.S. PATENT DOCUMENTS

| 4,594,566 A | 6/1986 | Maudsley |
|---|---|---|
| 4,746,866 A | 5/1988 | Roschmann |
| 4,751,464 A | 6/1988 | Bridges |
| 4,939,465 A | 7/1990 | Biehl et al. |
| 5,543,711 A | 8/1996 | Srinivasan et al. |
| 5,557,247 A | 9/1996 | Vaughn |
| 6,029,082 A | 2/2000 | Srinivasan et al. |
| 6,043,658 A | 3/2000 | Leussler |
| 6,462,636 B1 | 10/2002 | Overweg et al. |
| 6,591,128 B1 | 7/2003 | Wu et al. |
| 6,608,480 B1 | 8/2003 | Weyers |

(Continued)

FOREIGN PATENT DOCUMENTS

| DE | 10109489 A1 | 10/2001 |
|---|---|---|
| WO | WO02/095435 A1 | 11/2002 |

OTHER PUBLICATIONS

Vaughan, T., et al.; Volume Coils for Highest Field MRI; 2001; IEEE Antennas and Propagation Society Intl. Symposium; vol. 1; 378-381.

(Continued)

*Primary Examiner*—Louis M. Arana (57) ABSTRACT

A radio frequency coil for a magnetic resonance imaging system includes a birdcage section having a plurality of parallel spaced apart conductors and one or more cross or end conductors aligned generally transverse to the spaced apart conductors, and a TEM section having a plurality of parallel spaced apart conductors and a radio frequency screen. The birdcage section and the TEM section resonate at a birdcage resonant frequency and a TEM resonant frequency, respectively. The birdcage section and the TEM section are relatively disposed with the parallel spaced apart conductors of each section aligned and define a subject receiving region.

20 Claims, 13 Drawing Sheets

U.S. PATENT DOCUMENTS

| | | | |
|---|---|---|---|
| 6,958,607 B2 | 10/2005 | Vaughan et al. | |
| 7,135,864 B1 * | 11/2006 | McKinnon et al. | 324/318 |
| 2002/0165447 A1 | 11/2002 | Boskamp et al. | |
| 2003/0020476 A1 | 1/2003 | Duensing | |
| 2003/0122546 A1 | 7/2003 | Leussler | |

OTHER PUBLICATIONS

Hayes, C.E., et al.; An Efficient, Highly Homogeneous Radiofrequency Coil for Whole-Body NMR Imaging at 1.5T; 1985; J. Mag. Reson.; 63:622-628.

* cited by examiner

HYBRID TEM/BIRDCAGE COIL FOR MRI

CROSS REFERENCE TO RELATED APPLICATIONS

This application claims the benefit of U.S. provisional application Ser. No. 60/520,880 filed Nov. 18, 2003, which is incorporated herein by reference.

The following relates to the magnetic resonance arts. It finds particular application in magnetic resonance imaging, and will be described with particular reference thereto. However, it also finds application in magnetic resonance spectroscopy and other magnetic resonance applications.

Two types of radio frequency coils commonly used in magnetic resonance imaging are birdcage coils and transverse electromagnetic (TEM) coils. Each type of coil has certain advantages and disadvantages.

Birdcage coils include a plurality of parallel spaced apart conductors (sometimes called "rungs") on the surface of a cylinder and end conductors in the form of an end cap and a ring or a pair of end rings transverse to the rungs. The resonance modes of these coils are typically a single whole volume resonator with current flowing rung-to-rung. Birdcage coils can have a substantially open geometry that does not produce claustrophobic effects on human imaging subjects, thus promoting patient comfort. Birdcage coils also exhibit good radio frequency properties, such as high quality factors, for frequencies of about 128 MHz or lower, corresponding to proton resonance in main ($B_o$) magnetic fields of about 3 T or lower. However, for higher frequencies corresponding to $B_o>3$ T birdcage coil performance is increasingly limited by strong coupling with imaging subject tissue and radiative losses of the radio frequency energy.

TEM coils include a plurality of parallel spaced apart conductors (sometimes called "rungs") and a coupled cylindrical radio frequency screen providing current return paths. Resonance modes of TEM coils are typically rung-to-screen, although some rung-to-rung resonance modes may also be supported. The radio frequency screen is typically a metal mesh or conductive foil. TEM coils typically provide improved radio frequency performance compared with birdcage coils for higher frequencies corresponding to $B_o>3$ T due at least to radiative loss reductions provided by the screen. However, TEM head coils or whole-body coils have the disadvantage of enclosing the head or the entire imaging subject, respectively, within the cylindrical radio frequency screen. Human imaging subjects sometimes find such confined enclosure be claustrophobic.

A problem common to both birdcage and TEM coils is their fixed diameter, which is determined by the diameter of the rings in the case of a birdcage coil, and by the diameter of the cylindrical radio frequency screen in the case of a TEM coil. A coil approximately sized to match the imaging subject improves radio frequency coupling with the imaging subject, allowing the input radio frequency power to be reduced. However, the cylindrical whole-body birdcage or TEM coil typically surrounds the patient bridge, or other components, which can complicate removal and insertion of different coils.

The present invention contemplates a new and improved method and apparatus which overcomes the above-referenced problem and others.

According to one aspect, a radio frequency coil is disclosed for a magnetic resonance imaging system, including a birdcage section and a TEM section. The birdcage section includes a plurality of parallel spaced apart conductors and one or more end conductors aligned generally transverse to the spaced apart conductors. The birdcage section resonates at a birdcage resonant frequency. The TEM section includes a plurality of parallel spaced apart conductors and a radio frequency screen. The TEM section resonates at a TEM resonant frequency. The birdcage section and the TEM section are relatively disposed with the parallel spaced apart conductors of each section aligned. The birdcage section and the TEM section cooperatively define a subject receiving region.

According to another aspect, a magnetic resonance imaging scanner is disclosed. A radio frequency coil including a birdcage section and a TEM section encompasses a subject receiving region. A magnet generates a temporally constant main magnetic field through the subject receiving region. A plurality of magnetic field gradient coils are arranged to produce magnetic field gradients across the main magnetic field in the subject receiving region. The birdcage section of the radio frequency coil includes a plurality of parallel spaced apart conductors and one or more end conductors aligned generally transverse to the spaced apart conductors. The birdcage section resonates at a birdcage resonant frequency. The TEM section of the radio frequency coil includes a plurality of parallel spaced apart conductors and a radio frequency screen. The TEM section resonates at a TEM resonant frequency. The birdcage section and the TEM section are relatively disposed with the parallel spaced apart conductors of each section aligned. The birdcage section and the TEM section cooperatively define the subject receiving region.

According to yet another aspect, a radio frequency coil is disclosed. A birdcage section includes a plurality of parallel spaced apart conductors and one or more cross conductors disposed generally transverse to the spaced apart conductors. A TEM radio frequency screen section includes a radio frequency screen coupled with the birdcage section and having openings corresponding to spacings of the spaced apart conductors, and transparent or translucent dielectric material disposed in the openings of the radio frequency screen. The transparent or translucent dielectric material allows an associated imaging subject disposed inside the coil to see through the radio frequency coil.

One advantage resides in combining high patient visibility afforded by the relatively open birdcage configuration with improved high radio frequency characteristics afforded by the TEM coil configuration.

Another advantage resides in providing a removable, relatively open birdcage section that is swappable with at least one other coil section appropriate to a selected imaging procedure.

Yet another advantage resides in providing an asymmetric radio frequency coil having a generally planar TEM section integrated with the subject bridge and an arcuate birdcage portion.

Still yet another advantage resides in providing a coil that can be operated either as a volume resonator or as a phased coil array for parallel imaging, SENSE imaging, or the like.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for purposes of illustrating the preferred embodiments and are not be construed as limiting the invention.

FIG. 5 shows an end view of a generally cylindrical radio frequency coil having coupled TEM and birdcage sections. FIG. 5 also shows suitable port connections for driving the coil as a volume resonator.

Figure 1:
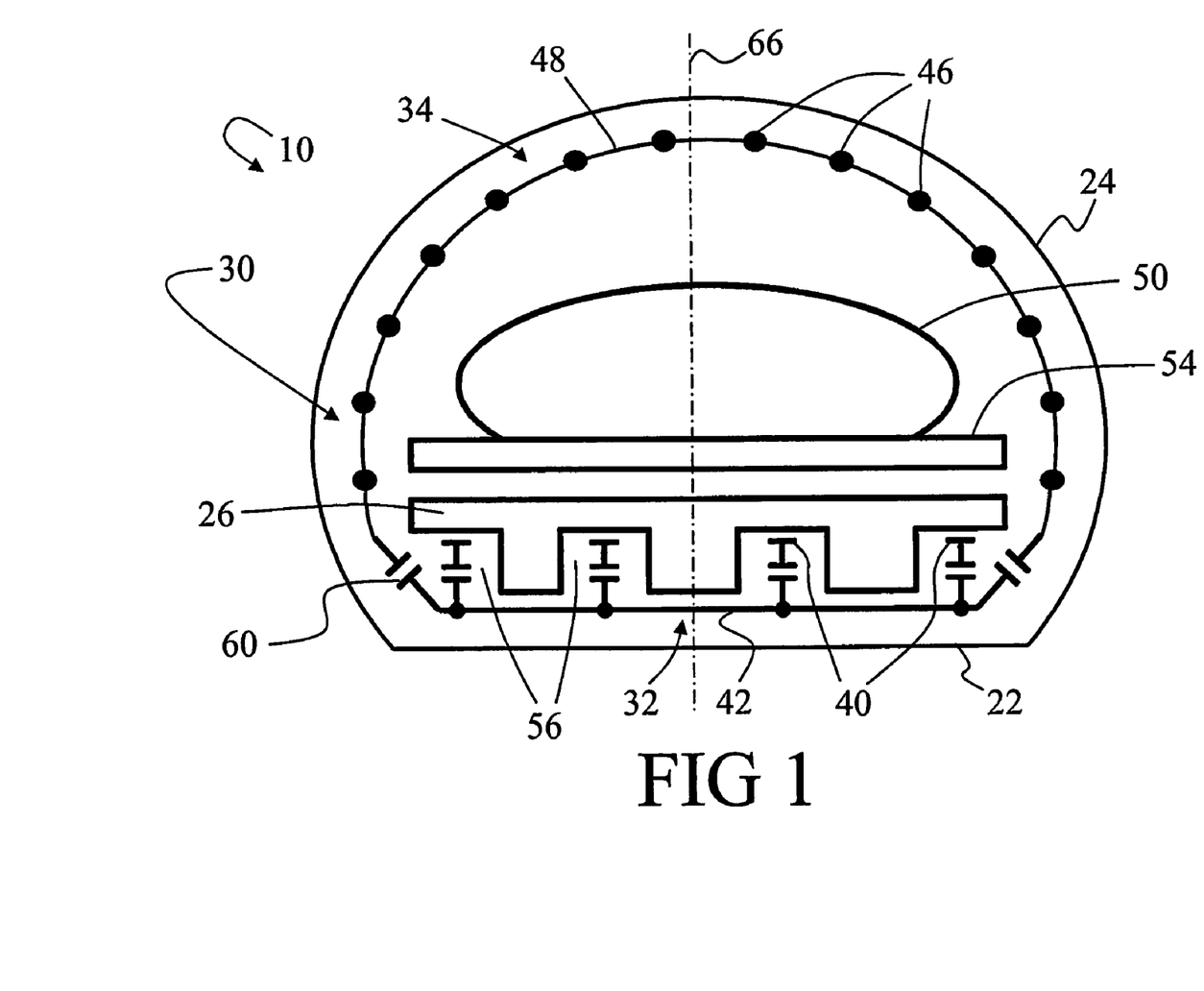
FIG. 1 diagrammatically shows an end view of a magnetic resonance imaging scanner incorporating a radio frequency coil having a generally planar TEM section and an arcuate birdcage section.
Figure 2:
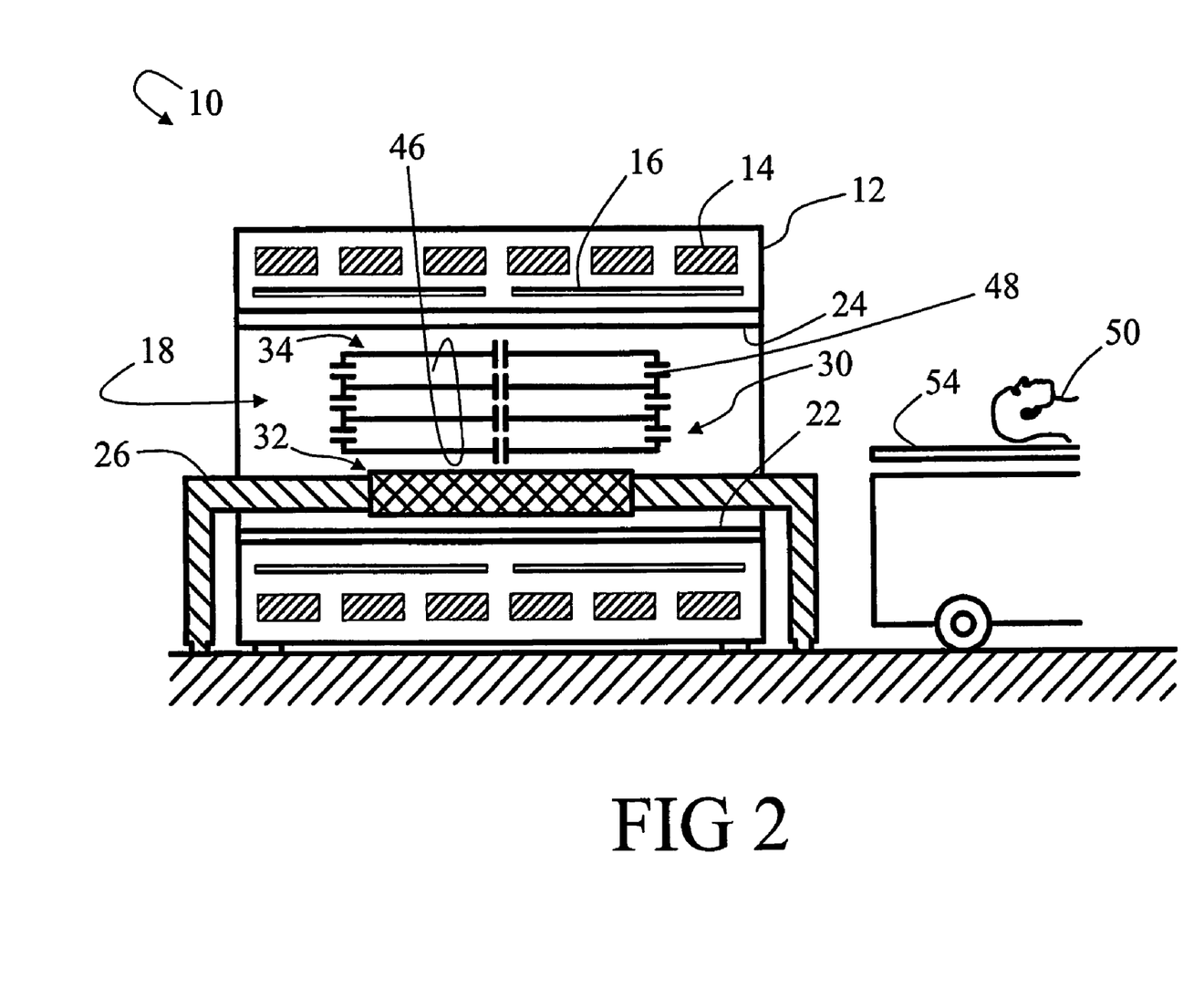
FIG. 2 diagrammatically shows a side view of the magnetic resonance imaging scanner of FIG. 1, in which about one-half of the scanner is cut away to show internal features. A movable couch for transporting an imaging subject into the scanner bore is also shown in FIG. 2.

With reference to FIGS. 1 and 2, in one embodiment a magnetic resonance scanner 10 includes a main housing 12 that houses or support at least main magnetic field coils 14 and magnetic field gradient coils 16. The main magnetic field coils 14 generate a main $B_o$ field along a magnet bore 18 defined by the housing 12, while the magnetic field gradient coils 16 produce selected magnetic field gradients within the magnet bore 18.

A shielding radio frequency screen approximately coextensive with the magnet bore 18 includes a generally planar bottom portion 22 and an arcuate upper portion 24. A subject bridge 26 extends through the bore 18 and is disposed above the generally planar bottom portion 22 of the shielding radio frequency screen. In another embodiment, the shielding radio frequency screen is cylindrical.

A radio frequency coil 30 includes a generally planar bottom transverse electromagnetic (TEM) section 32 and an arcuate upper birdcage section 34 together encompassing a subject receiving region. The TEM section 32 includes a plurality of conductors or rungs 40 and a radio frequency screen 42 capacitively coupled to the rungs 40 (couplings indicated in FIG. 1). The birdcage section 34 includes a plurality of conductors or rungs 46 and transverse end members 48 in the form of arcuate partial rings or an arcuate end cap at one end and an arcuate ring at the other defining the arcuate cross-section of the birdcage section 34.

The longitudinal conductors 40, 46 and the conductive transverse cross members 48 can be, for example, conductive rods, copper traces formed on or in a printed circuit board, or the like. Capacitances in the conductors 40, 46 and the transverse cross members 48 are preferably distributed along the conductive rods, copper traces, or the like, or can be discrete capacitors mounted on a printed circuit board and coupled with the conductors as a hybrid circuit.

An imaging subject 50 is moved into the magnet bore 18 and inside the the coil sections 32, 34 using a movable pallet 54 supporting the imaging subject 50, which is pushed, pulled, or otherwise moved along a top supporting surface the subject bridge 26. In the embodiment of FIGS. 1 and 2, the rungs 40 of the TEM section 32 are disposed in slots 56 defined in the underside of the subject bridge 26. Thus, the subject is disposed relatively close to the TEM section 32.

Figure 3:
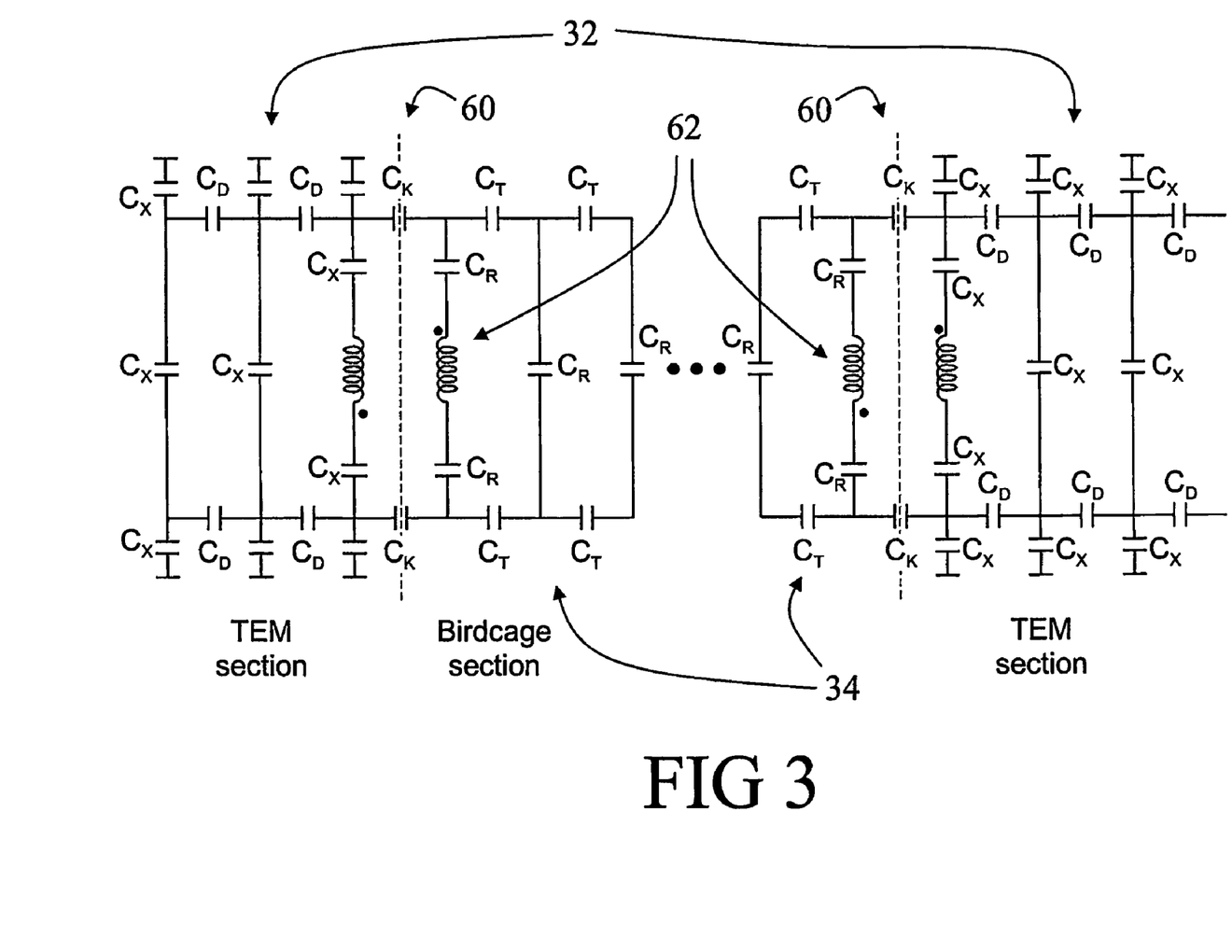
FIG. 3 shows an electrical schematic of coupling of the TEM and birdcage sections to define a volume resonator.

With reference to FIG. 1 and with further reference to FIG. 3, which shows an electrical schematic of connecting portions of the birdcage section 34 and the TEM section 32, the coil sections 32, 34 are optionally capacitively connected by capacitances 60 to form a volume resonator. The coupling capacitances 60 are represented in FIG. 3 by capacitances $C_K$; the rungs 46 and crossing members 48 of the birdcage section 34 include capacitances $C_R$ and $C_T$, respectively; and the rungs 40 and radio frequency screen 42 of the TEM section 32 include capacitances $C_X$ and $C_D$, respectively.

Optionally, the two sections 32, 34 can also be coupled by an inductive transformers 62 as indicated in FIG. 3 to form a volume resonator. When the transformers 62 are used, the coupling capacitances $C_K$ 60 are optionally omitted. Advantageously, coupling using the inductive transformers 62 does not involve galvanic connections between the coil sections 32, 34. In another embodiment, a coaxial half-wave cable (not shown) is used for coupling the sections (32, 34) to define a volume resonator.

Figure 4:
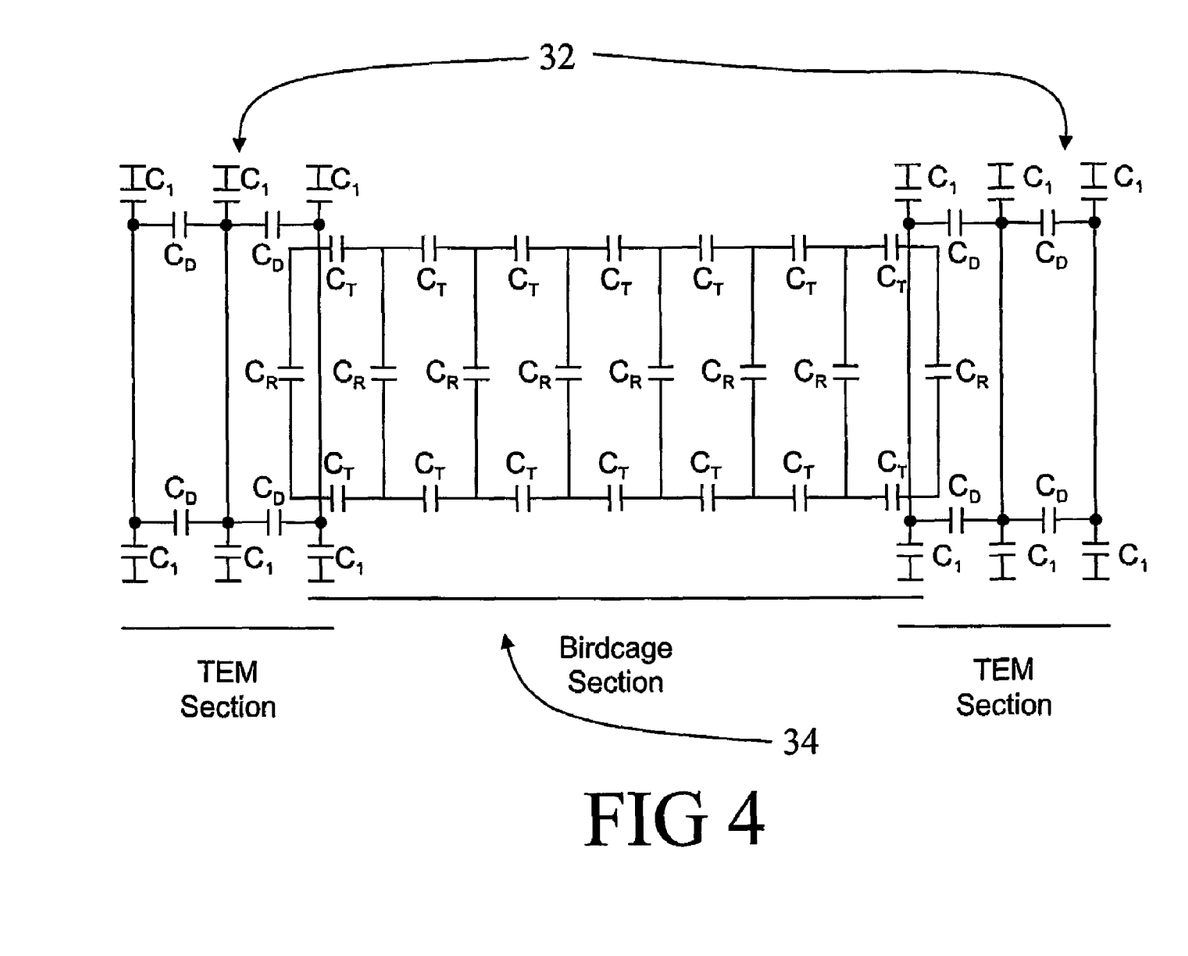
FIG. 4 shows an electrical schematic of another approach for coupling of the TEM and birdcage sections to define a volume resonator.

With reference to FIG. 4, in another embodiment the two sections 32, 34 are coupled by spatially overlapping the ends of the birdcage and TEM sections 32, 34. The approach also has the advantage of not involving galvanic connections between the coil sections 32, 34. Coupling between the sections 32, 34 is principally due to inductive coupling between rungs 46 of the birdcage section 34 that overlap the radio frequency screen 42 of the TEM section 32, as indicated in FIG. 4.

With returning reference to, FIG. 1, when the birdcage and TEM sections 32, 34 are coupled to define a volume resonator, the couplings at the two ends are preferably symmetric so that the volume resonator has a bilateral symmetry about a plane of symmetry 66. In the volume resonator configurations, the TEM section 32 and the birdcage section 34 resonate at a common volume resonance frequency. The impedances or other characteristics of the couplings 60, 62 between the two sections 32, 34 are selected to ensure resonance at the common volume resonance frequency.

Figure 5:
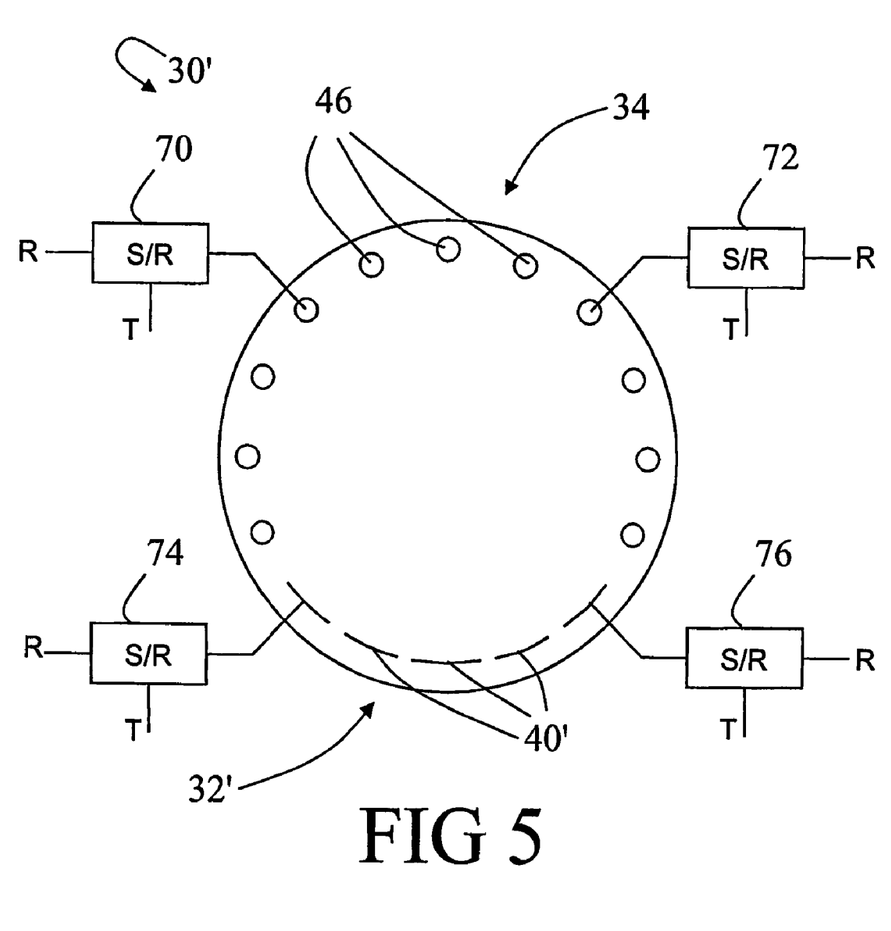

With reference to FIG. 5, a slightly modified radio frequency coil 30' has a curved elliptical or circular, rather than flat, TEM section 32' including conductors or rungs 40'.

When the birdcage and TEM sections 32', 34 are coupled to define a volume resonator, in one embodiment the resonator is driven using separate transmit/receive or send/receive (S/R) channels, specifically four S/R channels 70, 72, 74, 76 in the example of FIG. 5. Typically, at least two ports are coupled in each of the birdcage and TEM sections 32', 34 to provide control of phase and amplitude: in FIG. 5, S/R channels 70, 72 drive the birdcage section 34 while S/R channels 74, 76 drive the TEM section 32'. Other numbers and configurations of send/receive channels can also be used. In one embodiment, each conductor 46 of the birdcage section 34 and each conductor 40 of the TEM section 32' is separately driven by a dedicated send/receive channel. This allows individual conductors 40, 46 to be mutually coupled or decoupled to control homogeneity and signal-to-noise ratio. Similar driving arrangements can be used for the coil 30 of FIGS. 1 and 2 when coil 30 has sections 32, 34 interconnected to define a volume resonator.

Figure 6:
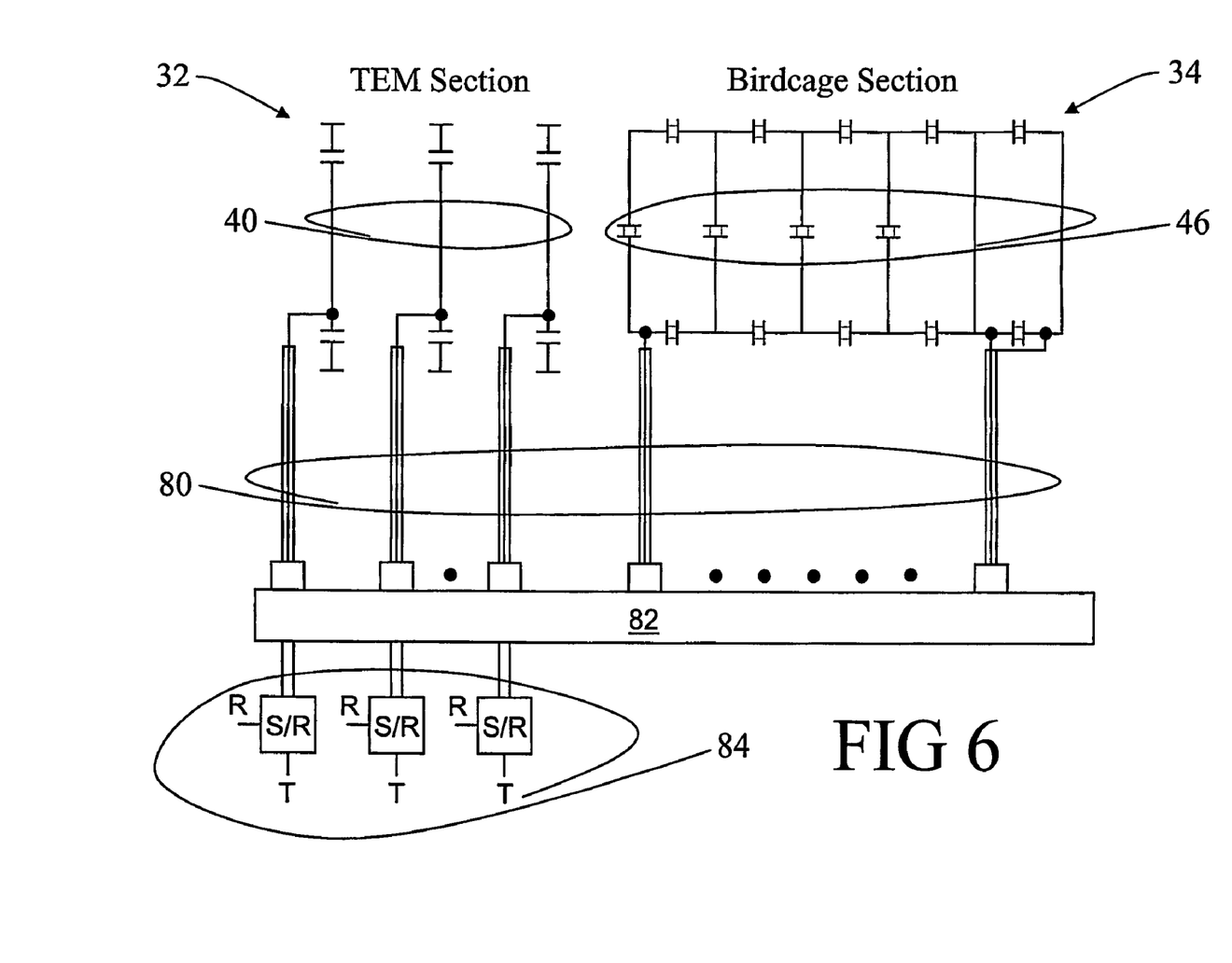
FIG. 6 shows a method for selectively coupling or decoupling individual conductors or rungs of a radio frequency coil having birdcage and TEM sections, and driving electronics for operating the selectively coupled and decoupled rungs as a phased coils array.

With reference to FIG. 6, selectable decoupling of conductors or rungs 40, 46 is provided to define a volume resonator or a selected phased array of sub-coils for use in parallel imaging modalities such as SENSE imaging. As shown in FIG. 6, decoupling of selected conductors 40, 46 is suitably accomplished by connecting each conductor via coaxial or other shielded cabling 80 to a remote impedance network 82. Each sub-coil is individually driven by a dedicated send/receive channel 84. Rather than independently driving each sub-coil through the remote impedance network 82 to achieve a phased array, phase-shifting impedances such as phase shifting capacitances can be arranged between sub-coils to provide selected decouplings defining the phased array.

Using either active coupling/decoupling as described with reference to FIG. 6 or passive decoupling using decoupling capacitors, one or both of the TEM section 32 and the birdcage section 34 can be operated as a phased coil array defined by sub-coils each made up of one or more of the conductors 40, 46. Selection of suitable decoupling impedances or of independent radio frequency driving signals for desired decouplings of the various conductors 40, 46 is described in Leussler, WO/02/095435 A1, published Nov. 28, 2002. In the case of active coupling and decoupling, different coil or sub-coil array configurations can be used for the radio frequency transmit and receive phases of the magnetic resonance imaging.

Figure 7A:
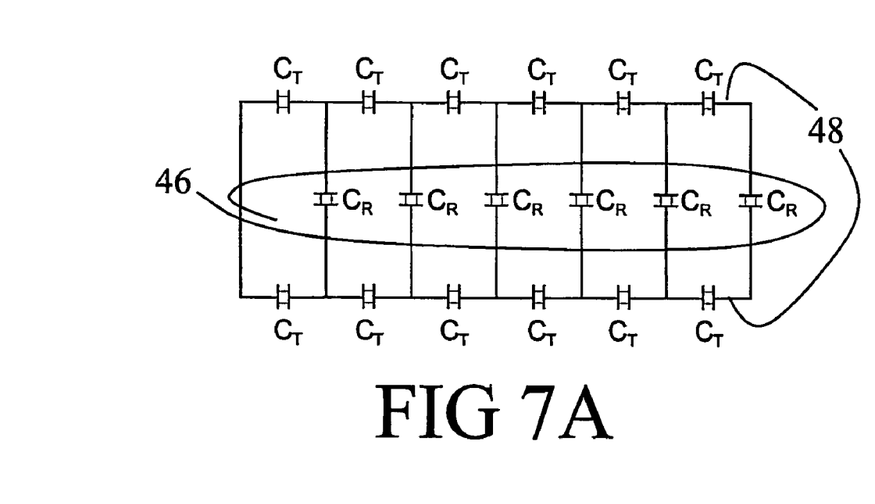
FIGS. 7A, 7B, 7C, and 7D show electrical schematics of several phased coils array configurations obtained by selectively defining sub-coils through the selective coupling and decoupling of conductors or rungs of a radio frequency coil having birdcage and TEM sections.
Figure 7B:
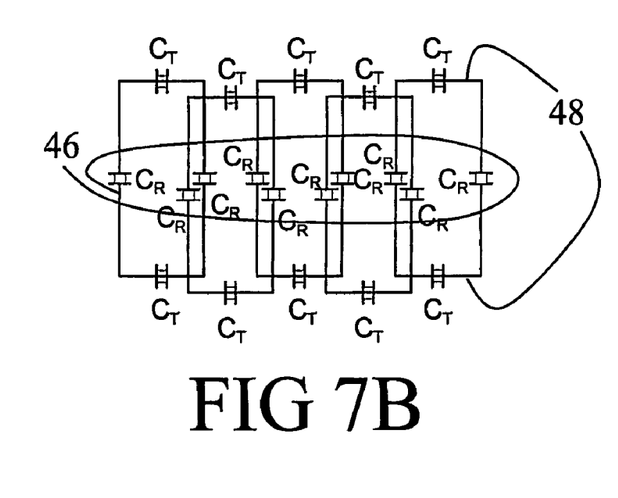
Figure 7C:
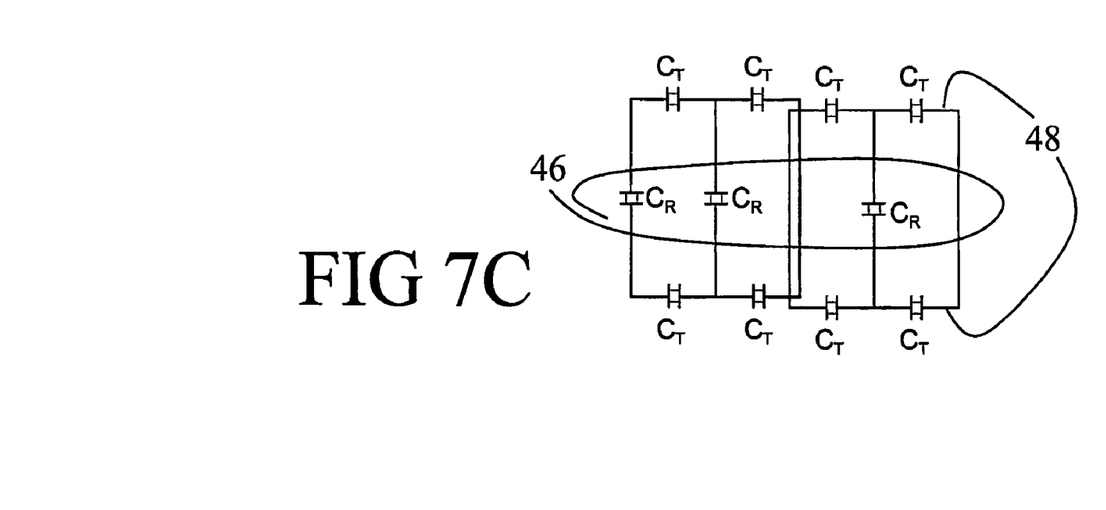
Figure 7D:
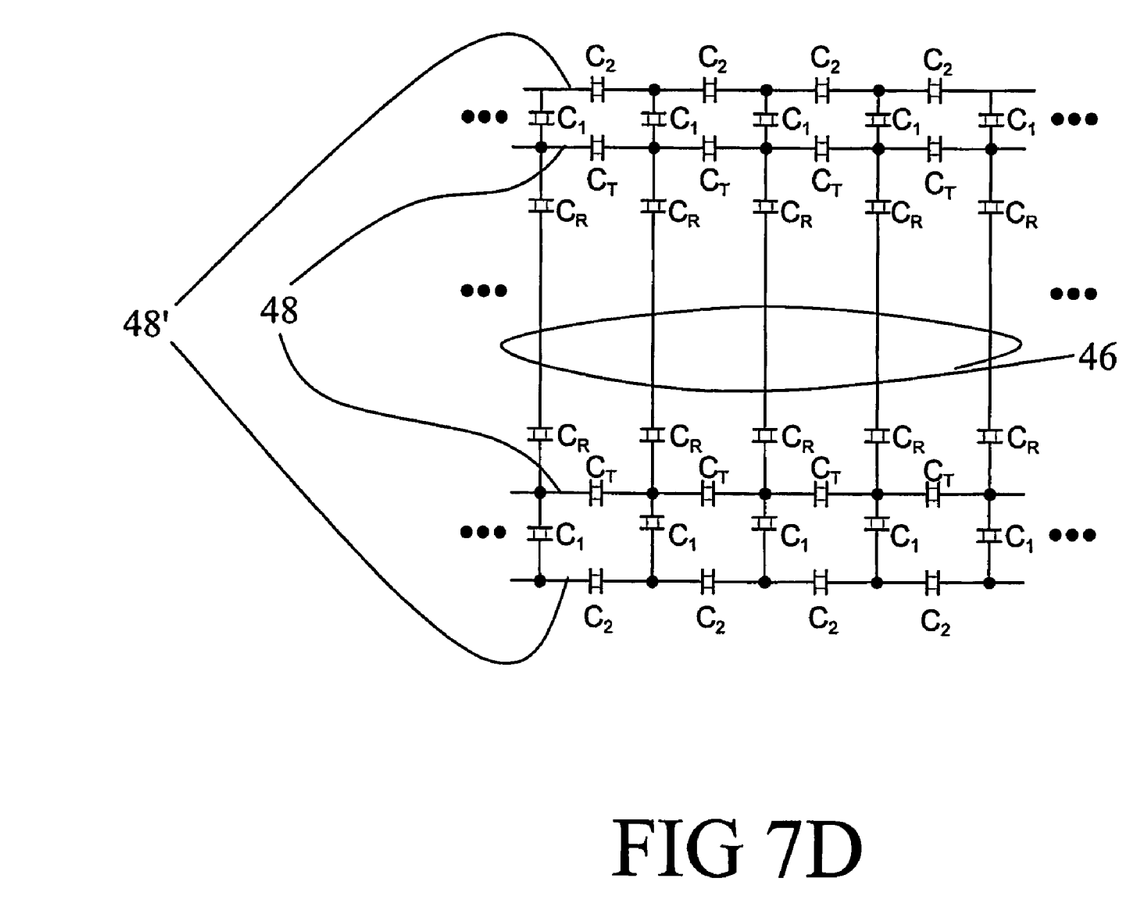

With reference to FIG. 7A, a decoupled bandpass section is formed using a dedicated capacitor ratio of conductor 46 or crossing member 48 capacitors. In FIG. 7B, inductive decoupling is achieved by selected overlap of sub-coils, or by including inductive transformers similar to the transformers 62 of FIG. 3. FIG. 7C shows a mixture of inductive and capacitive decoupling of individual sub-coils. FIG. 7D shows decoupling of bandpass networks formed by the birdcage conductors 46 and the transverse crossing members 48, in which the bandpass networks are decoupled from one another using additional ring conductors 48' with decoupling capacitances $C_1$ and $C_2$.

Figure 8:
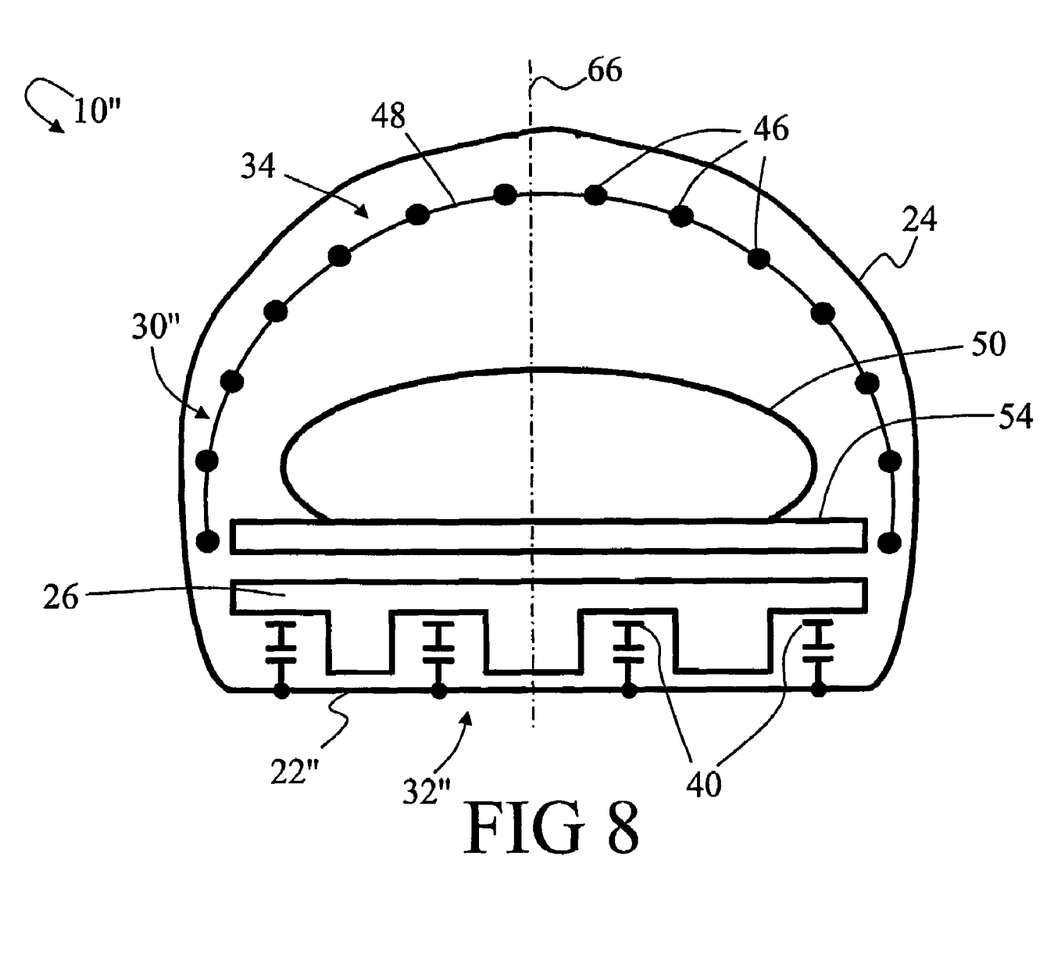
FIG. 8 diagrammatically shows an end view of a magnetic resonance imaging scanner incorporating a radio frequency coil having a generally planar TEM section and an arcuate birdcage section, in which an outer shielding radio frequency screen also serves as the radio frequency screen of the TEM section of the coil.

FIG. 8 shows a modified embodiment 10" of a magnetic resonance imaging scanner including a modified radio frequency coil 30", in which the lower shielding radio frequency screen 22 of the scanner 10 of FIG. 1 is modified to form a lower radio frequency screen portion 22" which also serves as the radio frequency screen of a modified TEM section 32". In the embodiment of FIG. 8, the conductors or rungs 40 of the modified TEM section 32" are capacitively coupled to the shielding radio frequency screen portion 22" so that the radio frequency screen portion 22" acts both as an active component of the TEM section 32" and as a shield for blocking stray radio frequency signals from interfering with other components of the scanner 10". In the scanner 10", the separate TEM radio frequency screen 42 is omitted, thus providing more space inside the magnet bore.

Figure 9:
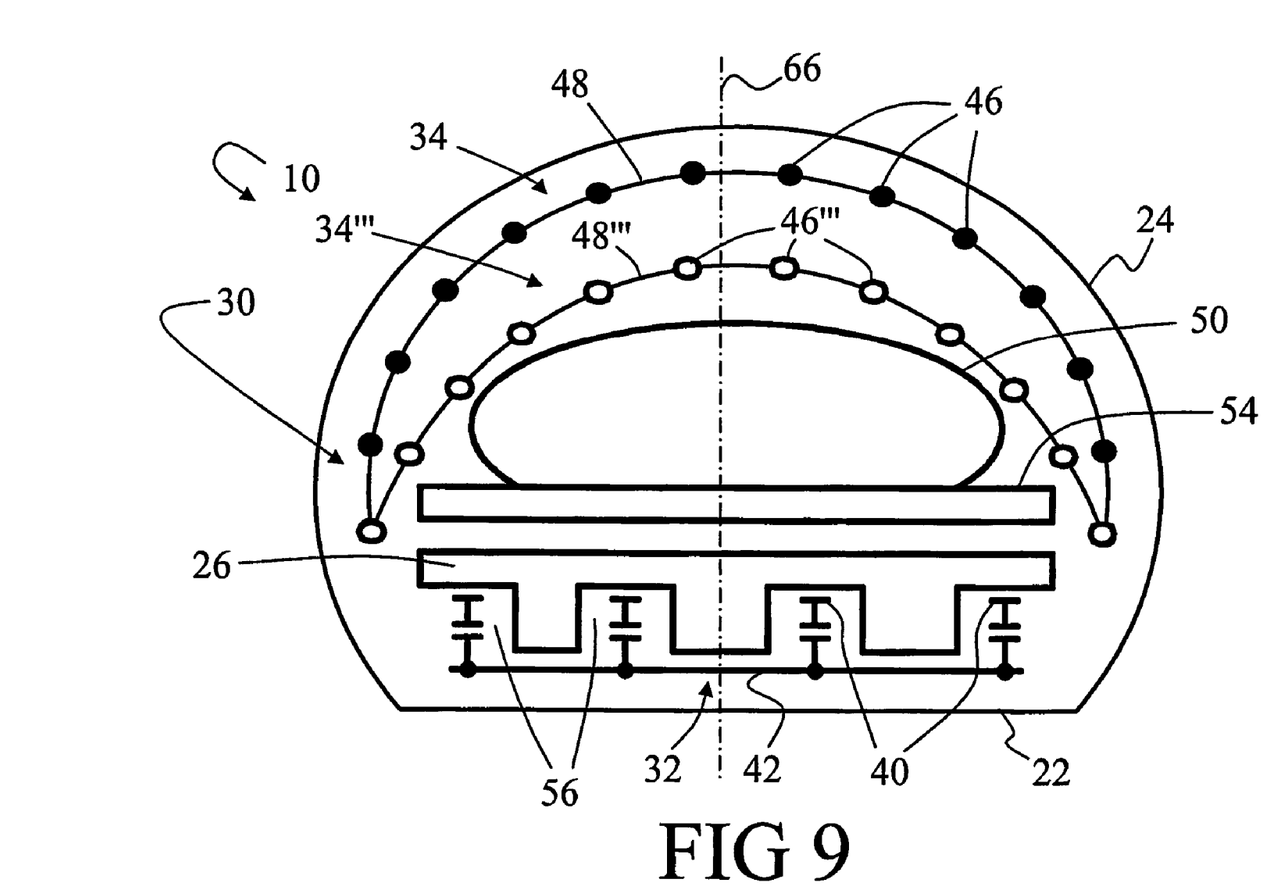
FIG. 9 diagrammatically shows an end view of a magnetic resonance imaging scanner incorporating a radio frequency coil having a generally planar TEM section and two swappable arcuate birdcage sections of different sizes.

In the embodiment of FIG. 9, the arcuate birdcage section is selected from a plurality of arcuate birdcage sections of different arc. FIG. 9 shows the radio frequency coil 10 of FIG. 1 with the birdcage section 34 electrically uncoupled from the TEM section 32. Optionally, the birdcage section 34 is replaced by a birdcage section 34''' formed of conductors or rungs 46''' and crossing members 48''' having a different arc. The replacement birdcage section 34''' has a different arc compared with the birdcage section 34 which places the birdcage section 34''' closer to the imaging subject 50 compared with the birdcage section 34. The closer arc of the replacement birdcage section 34''' may be advantageous for imaging a smaller imaging subject, as it provides stronger radio frequency signal coupling therewith.

While two swappable birdcage sections 34, 34''' are illustrated in FIG. 9, additional swappable birdcage sections having other arcs or other characteristics can also be provided. For example, a swappable birdcage section can include unevenly spaced rungs to provide meshes of different sizes. In the illustrated embodiment, the TEM section 32 is mechanically integrated with the subject bridge 26 and is not removed when swapping the birdcage sections 34, 34'''. In forming volume resonators, different capacitive or inductive coupling elements may be used for coupling each swappable birdcage section 34, 34''' with the TEM section 32 to achieve the desired common volume resonance. It will be appreciated that the arcuate birdcage sections 34, 34''' can have various cross-sectional shapes, such as having an elliptic shape or an asymmetric shape. Moreover, some swappable birdcage sections may include ports for coupling with the impedance network 82 to provide actively selected sub-coil arrays, while other swappable birdcage section may include fixed passive decoupling impedances or may be designed without decoupling elements for use as volume resonators.

Figure 10:
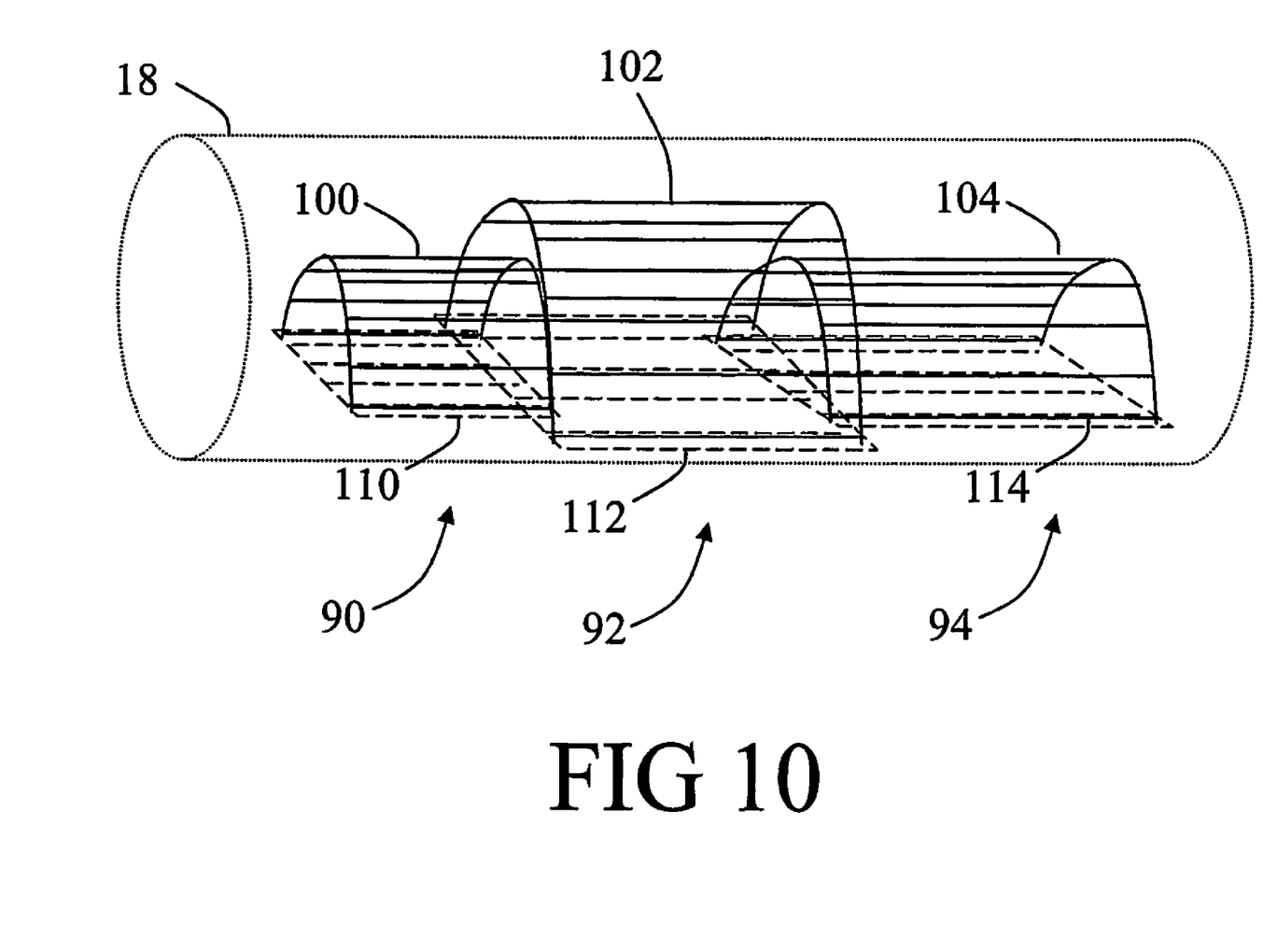
FIG. 10 diagrammatically shows three radio frequency coils of different sizes each having a generally planar TEM section and an arcuate birdcage section. The three radio frequency coils are arranged at different positions along the axis of the magnet bore to image the head, torso, and legs, respectively, of a prone human imaging subject.

With reference to FIG. 10, a plurality of radio frequency coils 90, 92, 94 each having a birdcage section 100, 102, 104 and a TEM section 110, 112, 114 defining a coil bore are arranged along the magnet bore 18 (indicated by dotted lines in FIG. 10). Use of a plurality of coils arranged along the axis of the bore 18 allows each coil to be optimized for a particular imaging region of interest. For example, the coil 90 is sized to match a head region of a prone human imaging subject, the coil 92 is sized to match the torso region of the prone human imaging subject, and the coil 94 is sized to match the legs region of the prone human imaging subject. Each coil 90, 92, 94 can be connected to one or more dedicated transmit/receive magnetic resonance spectrometers for specific imaging applications.

Figure 11:
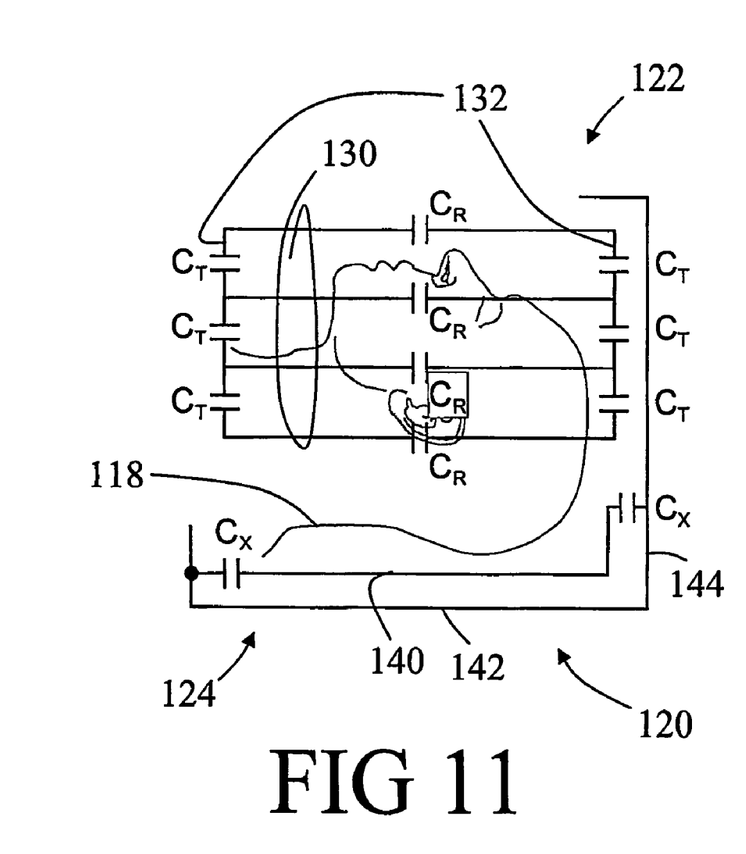
FIGS. 11 and 12 diagrammatically show radio frequency head coil embodiments each having a TEM section and a birdcage section.

With reference to FIG. 11, a human head 118 is illustrated disposed inside a dedicated head radio frequency coil 120 that includes a birdcage section 122 and a TEM section 124. The birdcage section 122 includes parallel spaced apart conductors or rungs 130 and transverse cross members 132 (indicated diagrammatically in FIG. 11). The TEM section 124 includes parallel spaced apart conductors or rungs 140 and a radio frequency screen, having a first screen portion 142 disposed adjacent the parallel spaced apart conductors or rungs 140 and an endcap screen portion 144 transverse to the parallel spaced apart conductors or rungs 140. The first screen portion 142 can be planar, smoothly curved, or contoured to approximately match contours of the head 118.

The endcap screen portion 144 provides a radio frequency reference ground so that the coil 120 is less perturbed by cable waves. The endcap screen portion 144 also reduces radiative energy losses and reflects radio frequency energy back into the imaging region. The birdcage section can be shielded by a transparent or translucent radio frequency screen with openings between the rungs 140 to provide visibility for the subject 118. (This arrangement is similar to the radio frequency coil shown in FIG. 13, discussed infra). In another embodiment, a birdcage screen is provided (not shown) that includes rungs similar to the rungs 140 but at a larger spacing from the head 118. The birdcage screen can be resonant or non-resonant. The coil 120 can also be used as a volume coil in which the top and bottom sections 122, 124 are connected by impedance networks. In another imaging approach, individual conductors are mutually decoupled passively or using an impedance network, so that the head coil 120 serves as a phased coils array for parallel imaging or SENSE imaging.

Figure 12:
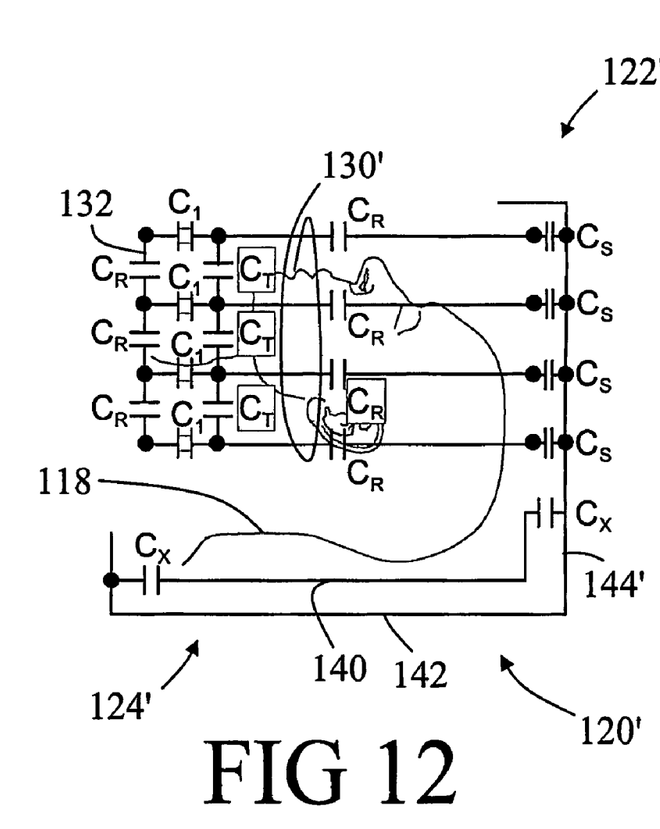

With reference to FIG. 12, a head coil 120' similar to the head coil 120 of FIG. 11 is shown. The coil 120' differs from the coil 120 in that a modified TEM section 124' has a modified endcap screen portion 144' that also serves as an end member for interconnecting parallel spaced apart conductors or rungs 130' of a modified birdcage section 122'. The rungs 130' are connected with the endcap screen portion 144' by capacitances $C_S$. At higher frequencies, the radio frequency screen optionally is extended to also cover the top birdcage portion 122' to further reduce radiative losses.

Figure 13:
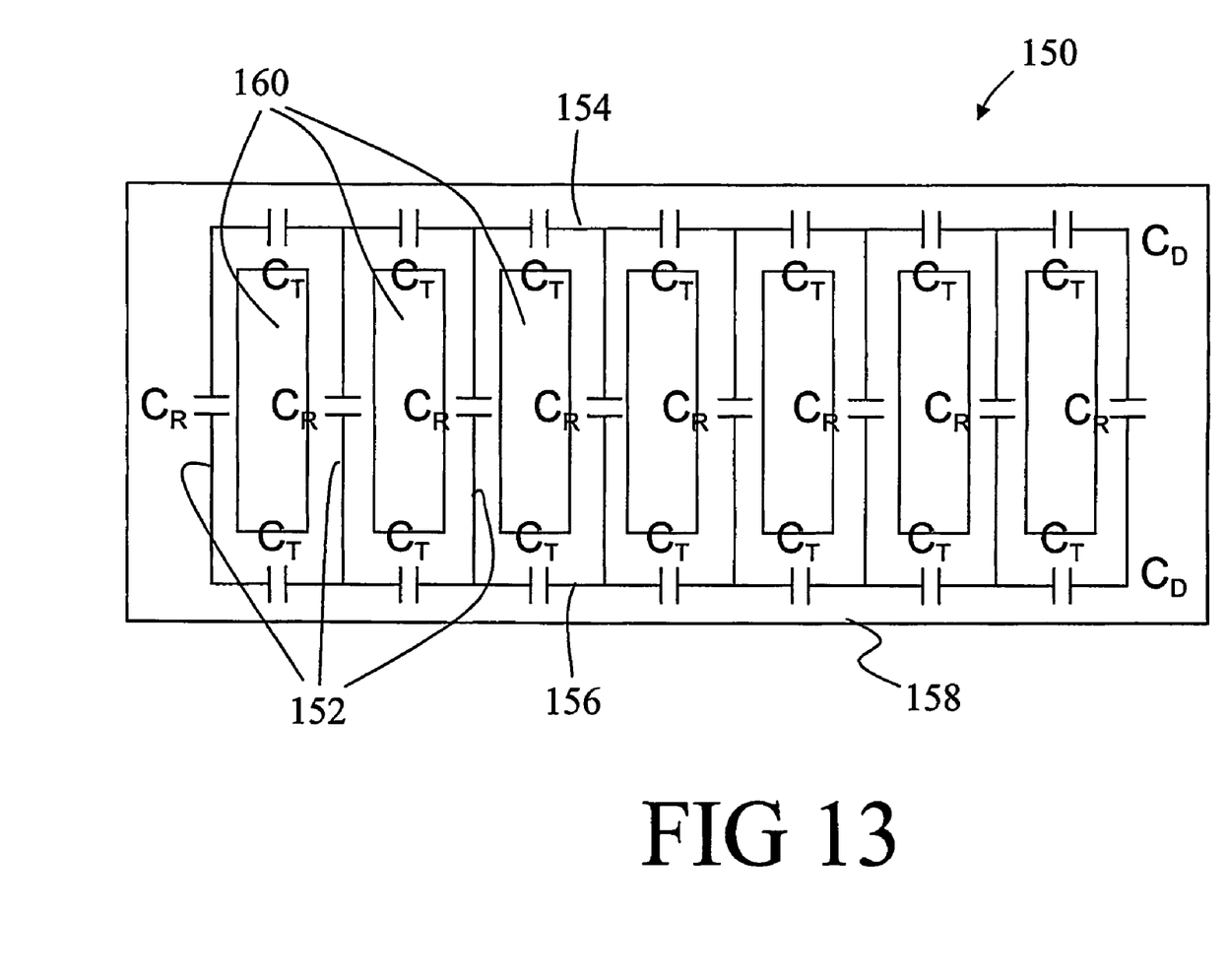
FIG. 13 diagrammatically shows a "rolled out" view of a radio frequency coil having a birdcage configuration and a relatively open radio frequency screen.

With reference to FIG. 13, another approach for retaining the relative openness of the birdcage coil configuration while obtaining the substantial high frequency benefits of a TEM-type coil is described. A radio frequency coil 150 is shown in a "rolled out" or planar view in which the generally cylindrical coil is unrolled and laid out flat for illustrative purposes. The coil 150 includes a plurality of conductors or rungs 152 each having a capacitance $C_R$ formed using stripline technology on printed circuit boards or another suitable substrate. Top and bottom transverse end members 154, 156 are similarly formed and include capacitances $C_T$. The capacitances $C_R$ and $C_T$ can be lumped discrete components, distributed components, or some combination thereof. Moreover, it will be appreciated that although the end-members 154, 156 appear linear in the "rolled out" view of FIG. 13, the end members 154, 156 are actually rings arranged transverse to the rungs 152. The conductors or rungs 152 and the end., member rings 154, 156 are disposed on a TEM radio frequency screen 158 that substantially reduces radiative energy losses. The TEM radio frequency screen 158 defines a cylinder. Transparent or translucent dielectric material 160 is disposed in openings of the radio frequency screen 158 between the conductors 152 and between the cross members 154, 156. In one embodiment the dielectric material 160 is air. The transparent or translucent dielectric material 160 provides improved visibility for a human imaging subject, while the TEM radio frequency screen 158 supports a resonance mode resonating at least between the conductors 152 and the TEM radio frequency screen 158 to improve radio frequency characteristics of the coil 150.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A radio frequency coil for a magnetic resonance imaging system, the radio frequency coil comprising:
    a birdcage section including a plurality of parallel spaced apart conductors and one or more end conductors aligned generally transverse to the spaced apart conductors, the birdcage section resonating at a birdcage resonant frequency;
    a TEM section including a plurality of parallel spaced apart conductors and a radio frequency screen, the TEM section resonating at a TEM resonant frequency, wherein the birdcage resonant frequency equals the TEM resonant frequency, the birdcage section and the TEM section being relatively disposed with the parallel spaced apart conductors of each section aligned, the birdcage section and the TEM section cooperatively defining a subject receiving region; and
    couplings between the birdcage section and the TEM section, the couplings cooperating with the birdcage section and the TEM section to define a volume resonator.

2. The radio frequency coil as set forth in claim 1, wherein the parallel spaced apart conductors of the birdcage section and the parallel spaced apart conductors of the TEM section each include one or more electrically interconnected components selected from a group consisting of:
    a linear printed copper trace on a printed circuit board,
    a discrete capacitance, and
    a conductive rod.

3. The radio frequency coil as set forth in claim 1, wherein the couplings are selected from a group consisting of:
    a radio frequency inductive transformer,
    a capacitive coupling,
    a coaxial half wave cable, and
    overlapping portions of the birdcage and TEM sections.

4. The radio frequency coil as set forth in claim 1, further including:
    couplings selectively arranged between selected spaced apart conductors of at least one of the birdcage section and the TEM section; and
    at least one radio frequency transmit/receive means for selectively defining an array of resonators.

5. The radio frequency coil as set forth in claim 4, wherein the couplings include one of:
    phase-shifting impedances arranged between selected spaced apart conductors, and
    a decoupling impedance network.

6. The radio frequency coil as set forth in claim 4, wherein the array of resonators define one of:
    a phased array of coils, and
    a SENSE coil array.

7. The radio frequency coil as set forth in claim 4, wherein the couplings include active switching components actively switched to effect the selective arrangement of the coupling/decoupling between selected parallel spaced apart conductors of at least one of the birdcage section and the TEM section.

8. The radio frequency coil as set forth in claim 1, wherein:
    the birdcage section has an arcuate cross section transverse to the parallel spaced apart conductors; and
    the TEM section is substantially planar.

9. The radio frequency coil as set forth in claim 1, further including:
    a second birdcage section including a plurality of parallel spaced apart conductors and one or more cross conductors aligned generally transverse to the spaced apart conductors, the second birdcage coil resonating at a second birdcage resonant frequency also equal to the TEM resonant frequency, the second birdcage section being interchangeable with the birdcage section such that the second birdcage section and the TEM section are relatively disposed with the parallel spaced apart conductors of each section aligned, the second birdcage section and the TEM section cooperatively defining the subject receiving region.

10. The radio frequency coil as set forth in claim 1, wherein the radio frequency screen of the TEM section includes:
    a first screen portion disposed adjacent the parallel spaced apart conductors of the TEM section; and
    an endcap screen portion transverse to the first screen portion and transverse to the parallel spaced apart conductors of the TEM section.

11. The radio frequency coil as set forth in claim 10, wherein the parallel spaced apart conductors of the birdcage section are capacitively coupled with the endcap screen portion of the radio frequency screen of the TEM section.

12. The radio frequency coil as set forth in claim 1, wherein the radio frequency screen includes:
    a TEM screen portion coupled with the parallel spaced apart conductors of the TEM section; and
    a shielding screen portion connected with the TEM screen portion, the shielding screen portion extending around outside the birdcage section and together with the TEM screen portion defining a shielding radio frequency screen inside of which the birdcage section and the conductors of the TEM section are disposed.

13. A magnetic resonance imaging scanner including:
    a radio frequency coil encompassing a subject receiving region, the radio frequency coil comprising (i) a birdcage section including a plurality of parallel spaced apart conductors and one or more end conductors aligned generally transverse to the spaced apart conductors, the birdcage section resonating at a birdcage resonant frequency, a TEM section including a plurality of parallel spaced apart conductors and a radio frequency screen, the TEM section resonating at a TEM resonant frequency matches the birdcage resonant frequency, the birdcage section and the TEM section being relatively disposed with the parallel spaced apart conductors of each section aligned, the birdcage section and the TEM section cooperatively surrounding the subject receiving region, and (iii) couplings between the birdcage section and the TEM section, the couplings cooperating with the birdcage section and the TEM section to define a volume resonator;
    a magnet which generates a temporally constant main magnetic field through the subject receiving region; and
    a plurality of magnetic field gradient coils arranged to produce magnetic field gradients across the main magnetic field in the subject receiving region.

14. The magnetic resonance imaging scanner as set forth in claim 13, wherein the radio frequency coil is further arranged with the conductive rods of the birdcage and TEM sections generally parallel to the main magnetic field.

15. The magnetic resonance imaging scanner as set forth in claim 13, further including:
    a subject supporting bridge having slots inside of which at least some of the parallel spaced apart conductors of the TEM section are disposed.

16. The magnetic resonance imaging scanner as set forth in claim 13, further including:
    a shielding radio frequency screen disposed around the radio frequency coil and spaced apart therefrom.

17. The magnetic resonance imaging scanner as set forth in claim 13, further including:
    a second birdcage section including a plurality of parallel spaced apart conductors and one or more cross conductors aligned generally transverse to the spaced apart conductors, the second birdcage coil resonating at a second birdcage resonant frequency, the second birdcage section being swappable for the birdcage section of the radio frequency coil such that the second birdcage section and the TEM section are relatively disposed with the parallel spaced apart conductors of each section aligned, the second birdcage section and the TEM section cooperatively defining the subject receiving region.

18. A radio frequency coil comprising:
    a birdcage section including a plurality of parallel spaced apart conductors and one or more end conductors aligned generally transverse to the spaced apart conductors;
    a TEM section including a plurality of parallel spaced apart conductors and a radio frequency screen, the birdcage section and the TEM section being relatively disposed with the parallel spaced apart conductors of each section aligned, neither the birdcage section nor the TEM section alone defining a complete circumference around a subject receiving region but the birdcage section and the TEM section together cooperatively defining a complete circumference around the subject receiving region; and
    couplings between the birdcage section and the TEM section, the couplings cooperating with the birdcage section and the TEM section to define a volume resonator.

19. The radio frequency coil as set forth in claim 18, wherein the couplings are selected from a group consisting of:
    a radio frequency inductive transformer,
    a capacitive coupling,
    a coaxial half wave cable, and
    overlapping portions of the birdcage and TEM sections.

20. The radio frequency coil as set forth in claim 18, further comprising:
    couplings selectively arranged between selected spaced apart conductors of at least one of the birdcage section and the TEM section; and
    at least one radio frequency transmit/receive means for selectively defining an array of resonators.

* * * * *